United States Patent [19]

Doak

[11] Patent Number: 5,521,550
[45] Date of Patent: May 28, 1996

[54] DIGITAL CIRCUITRY FOR NOISE BLANKING

[75] Inventor: David B. Doak, Boonton, N.J.

[73] Assignee: AT&T Corp., Murray Hill, N.J.

[21] Appl. No.: 363,488

[22] Filed: Dec. 23, 1994

[51] Int. Cl.⁶ .................................. H03F 1/26; H03F 3/38
[52] U.S. Cl. ................ 330/10; 327/166; 327/384; 330/149
[58] Field of Search .................. 330/10, 207 A, 330/251, 149; 327/166, 176, 361, 379, 384

[56] References Cited

U.S. PATENT DOCUMENTS 5,077,540  12/1991  Keith et al. ................... 330/10 X

FOREIGN PATENT DOCUMENTS 2841171  3/1980  Germany ................... 327/176
9230325  12/1984  Japan ................... 327/176
1294923  12/1986  Japan ................... 327/166

Primary Examiner—James B. Mullins

[57] ABSTRACT

A logic circuit and logic sequence cooperating with a PWM circuit to blank unwanted noise signals trailing a PWM pulse.

13 Claims, 2 Drawing Sheets

DIGITAL CIRCUITRY FOR NOISE BLANKING

GOVERNMENT CONTRACT

This invention was made with Government support under Contract No. 0024-90-C-0258. The Government has certain rights in this invention.

BACKGROUND OF THE INVENTION

1. Field of the Invention

This invention relates to electronic signal conditioning; and more specifically to control circuits for "blanking" the effects of noise radiated and electronically coupled by high voltage switching circuits.

2. Description of Related Art

Often, in applications involving structural and acoustic control of mechanical devices, amplifiers operating as Class-D types (switching), are used to drive active load elements, which, in turn, apply mechanical forces to the mechanical devices to be controlled. An example of one such amplifier is shown in U.S. Pat. No. 4,628,275.

It is also common in these applications to have a filter preceding the load containing an inductor for filtering purposes. As the output circuit turns the load current on and off, the inductor resists the change in current, creating a transient voltage spike, which is radiated through the air and through various parts of the circuit, housing, chassis and, importantly, over the ground line.

The problems associated with transient voltages ("noise") are particularly serious in pulse-width modulated (PWM) circuitry which employ level-comparing techniques to derive operating signals. In such systems, transient voltages are fed back, becoming error signals which are confused with the desired signals.

Error signals can occur timewise such that they create unwanted extra pulses actually inside a desired PWM pulse or trailing a PWM pulse. The unwanted extra pulses within desired PWM pulses can be eliminated, or severely reduced, with a low-pass filter where the additional signal delay is acceptable. Error signals which cause unwanted extra pulses trailing ("after") the desired PWM pulse are more difficult to eliminate, and must be dealt with by conventional EMI reduction methods, which are often very costly.

SUMMARY OF THE INVENTION

The present invention relates to a logic circuit particularly adapted to work with PWM systems, which employs "noise blanking" to reduce errors caused by switching transients. The noise blanking logic circuit controls a Class-D switching amplifier so that noise pulses, delivered after a desired PWM pulse, are ignored until the next desired pulse appears.

Utilizing logic circuitry triggered by a properly received sequence of signals from the PWM oscillator and comparator, the "noisy" PMW pulses are "regenerated" by the logic circuitry before being passed to the "switch" portion of the switching amplifier.

These as well as other features and advantages of the invention will be better understood with consideration of the following detailed description of the preferred embodiment of the invention taken in conjunction with the accompanying drawings.

DETAILED DESCRIPTION OF THE INVENTION

Figure 2A:
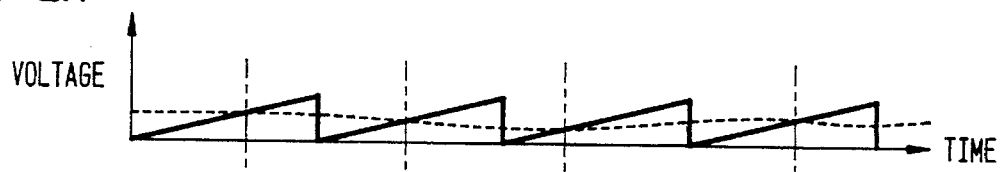
FIG. 2 shows the basic waveforms generated or utilized in PWM system.

Since PWM circuits, by nature, are susceptible to noise, let us begin this discussion with an overview of general PWM techniques. To form a PWM signal, an error voltage is compared (usually with an analog comparator integrated circuit) to a ramp signal. This is shown in FIG. 2a which is plot of voltage vs. time. The error signal is shown as the dashed, nearly horizontal line and the ramp signal as a sawtooth-shaped solid line. The resultant output (comparator) is given in FIG. 2b. FIG. 2c depicts an oscillator pulse which, as can be observed, corresponds to the frequency of the ramp signal. It is the oscillator pulse which will play a key role in blanking the noisy PWM pulses. Note should be taken of the fact that when the error voltage (FIG. 2a) is greater than the ramp voltage, the output of the comparator, and hence the PWM stage, is at the HI level and when the error voltage is lower than the ramp voltage, the comparator output is at the LO level.

Figure 1:
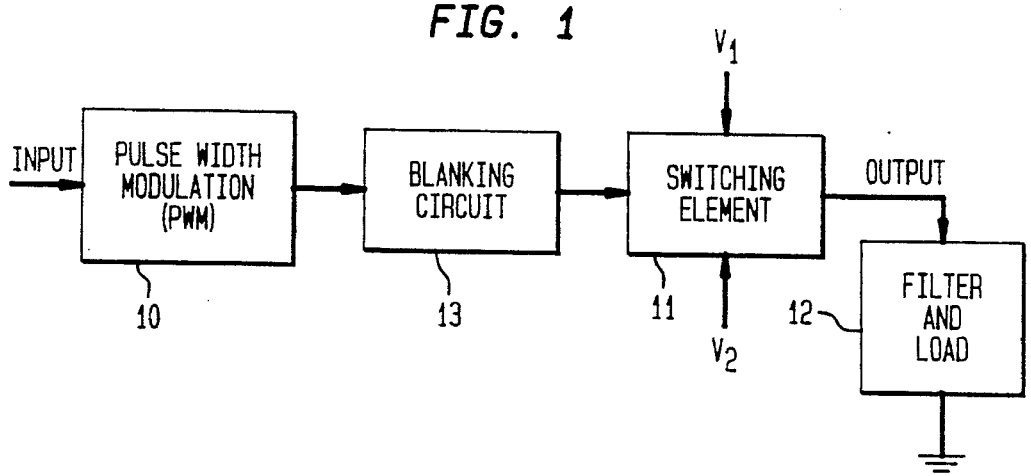
FIG. 1 shows, in block diagram form, the basic outline of a PWM system driving a load through a high voltage switching element with a blanking circuit interposed before the switching element.
Figure 3A:
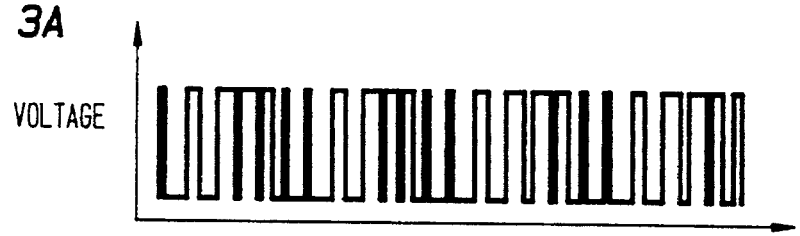
FIG. 3 shows one example of a pulse chain used to drive the switching element and the resulting waveform delivered to the load after filtering out the switching frequency.

When pulsing is repeated at a high frequency (known as the "switching frequency") a pulse chain similar to that shown in FIG. 3a is created. The pulse chain is used to drive the switching element (see FIG. 1). Whenever the output of PWM 10 as shown in FIG. 1 is HI, switching element 11 turns on, applying voltage V1 to filter and load 12. When the output of PWM 10 is LO, switching element 11 turns off, applying voltage level V2 across filter and load 12.

Figure 2B:
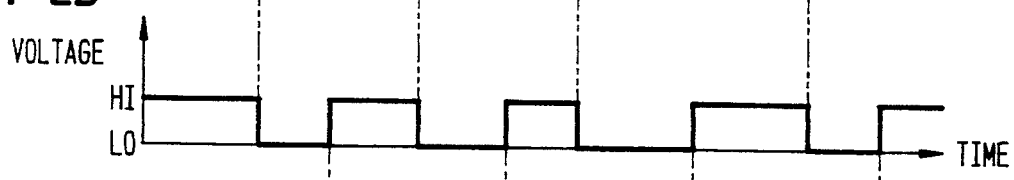
Figure 2C:
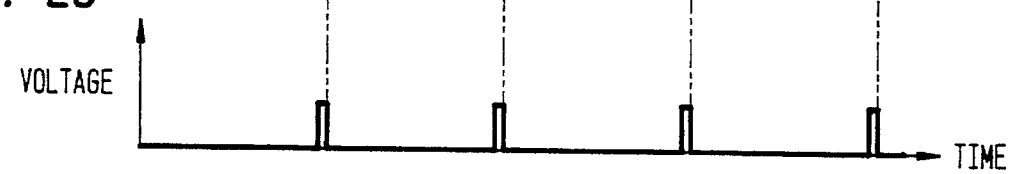
Figure 3B:
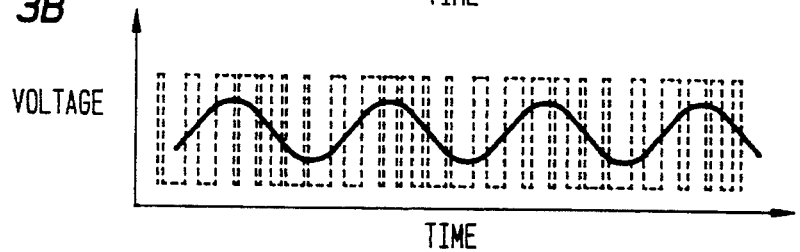

As can be observed with reference to FIGS. 2 and 3, the error voltage is generally time-varying (dashed line in FIG. 2a), causing the pulse width to change with the amplitude of the error voltage (FIGS. 2b and 3a). The switching frequency is removed from the signal through the filter action in filter and load 12, leaving only the frequency of the time-varying amplified error voltage (FIG. 3b) to be delivered to the load.

Figure 4A:
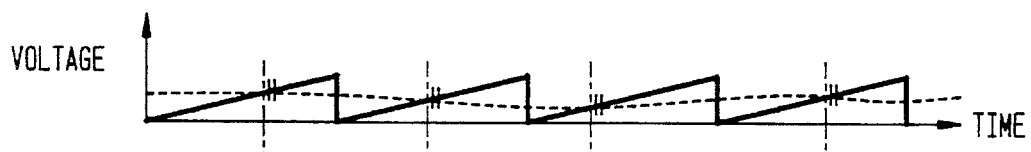
FIG. 4 shows the effect of transient noise coupled back to the PWM system after (FIG. 4a, b) the desired PWM pulse.
Figure 4B:

FIG. 4 depicts the type of noise signal which the subject invention eliminates. Specifically, FIG. 4a depicts the error voltage (desired signal) and ramp waveforms shown in FIG. 2a except that there is also switching transient contamination on the error voltage. The resulting PWM pulse at the output of the PWM comparator circuit is shown in FIG. 4b. Recalling that the output pulse is HI when the error voltage is greater than the ramp waveform, the transient noise signals on the error voltage in this example will cause two extra small pulses to appear after the desired PWM pulse. These extra pulses create distortion in the switching frequency and ultimately in the amplifier's output voltage waveform.

The foregoing undesirable effects of the extra small pulses are nullified by this invention which controls or blanks those small pulses so that they do not reach switching element 11. More precisely, utilizing the PWM oscillator signal in combination with the output comparator pulse, the logic blanking circuit 13 produces a clean PWM pulse. The circuit details of blanking circuit 13 are shown in greater detail in FIG. 5 and will be discussed at this point. The logic circuitry of FIG. 5 implements the following logic sequence in the order indicated:

Step 1. Wait for oscillator pulse to go high.

Step 2. Wait for PWM comparator output to go HI.

Step 3. Wait for PWM comparator output to go LO.

Step 4. Clamp or blank PWM output at LO until oscillator pulse goes high.

Figure 5:
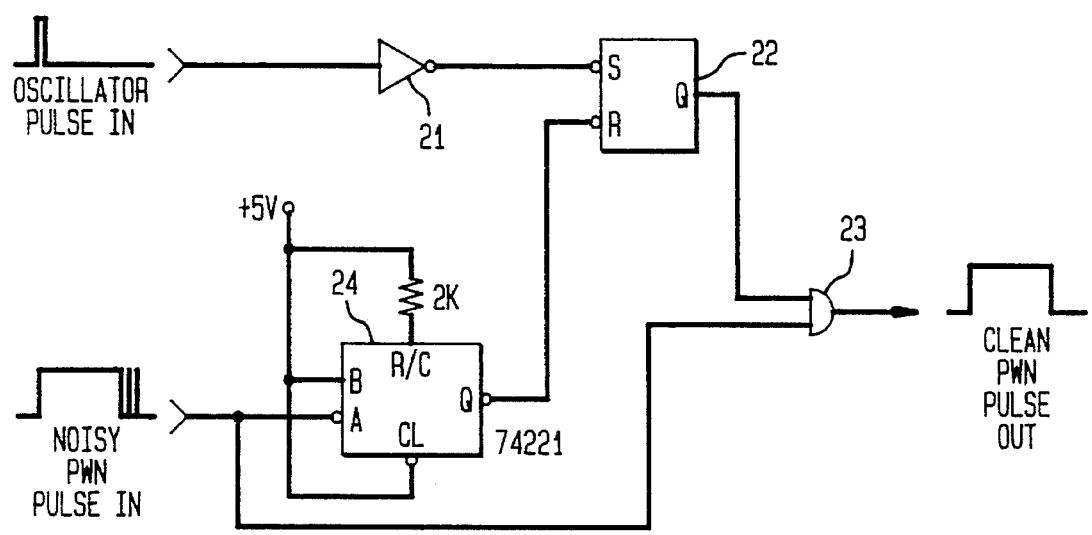
FIG. 5 is a schematic diagram the preferred embodiment of digital circuitry for blanking transient noise.

It is recognized by applicant that there are many ways to implement the logic sequence given above. FIG. 5 is illustrative and is applicant's preferred embodiment.

The circuit in FIG. 5 operates as follows. The oscillator pulse is inverted by invertor 21 and then applied to the S input of an S-R Latch (Flip-flop) 22, causing the output Q to be set (HI state). At about the same moment the leading edge (HI state) of the noisy PWM pulse is coupled to the AND gate 23, causing the output of this gate to go HI. This corresponds to the beginning (leading edge) of the clean PWM pulse. At the same time the 74221, a mono-stable multivibrator, device 24, has been configured so that it will output a very short (inverted) reset pulse to the R (reset) input of S-R Latch (Flip-flop) 22 as soon as the A input of device 24 goes LO (trailing edge of PWM pulse before noise). When the A input goes LO, S-R latch (Flip-flop) 22 resets until another oscillator pulse arrives. This event advantageously is after the transient noise pulses trailing the PWM pulses. The result is a clean PWM waveform at the output of AND gate 23.

As may be appreciated, the choice of devices used in the illustrative example, such as AND gate 23, will allow this logic circuit to be used in applications in which the beginning of the PWM pulse arrives at some unspecified time after the beginning of the oscillator pulse.

Changes and modifications in the specifically described embodiment can be made without departing from the scope of this invention.

I claim:

1. An electronic signal conditioning arrangement for blanking the effects of noise radiated or electronically coupled to a Pulse Width Modulating (PWM) circuit which provides oscillator pulses coincident with each output PWM pulse comprising means responsive to each one of said oscillator pulses coincident with the leading edge of each one of said PWM pulses for recording these events by changing to a first state, means responsive to the trailing edge of PWM pulses for altering said recording means so as to change from said first state to a second state, means responsive to said recording means for blanking the effects of noise following the trailing edge of said PWM pulses, and regenerating means responsive to said recording means for re-generating pulses of the same duration as each of said PWM pulses.

2. The invention recited in claim 1 wherein said signal conditioning arrangement is interposed between the output of a pulse width modulating circuit and a succeeding high voltage amplifier/driver stage.

3. The invention recited in claim 1 wherein said blanking means includes an AND gate having on a input responsive to the state of said recording means.

4. A circuit for connection to the output of a pulse width modulating stage and for cooperating therewith to blank out the effects of noise received by said stage and appearing after the trailing edge of one or more PWM stage pulse outputs comprising a two stage device connected to an output of said stage to indicate the start of a leading edge of each PWM stage pulse output, a PWM pulse sensing device capable of generating a short reset pulse at start of the trailing of each PWM pulse, blanking means responsive to said two stage device and PWM pulse whose width is determined exclusively by the interval elapsed between the leading and trailing edge of said PWM pulses, and wherein said output of said pulse sensing device resets said two stage device so that the output of said two stage device replicates the PWM pulse.

5. The circuit of claim 4 further incorporating a logic AND stage coupled to said two state device and to each of said PWM pulse outputs for regenerating each PWM pulse.

6. A noise blanking circuit for interposition between a pulse generating circuit and an output drive circuit for eliminating the effects of noise signals between desired pulses by regenerating each pulse comprising a pulse regeneration circuit responsive to separately spaced signals for generating a pulse having a width determined by the time elapsed between said spaced signals, means responsive to the leading edge of each desired pulse to generate said first spaced signal, and means for generating a second one of said spaced signals on detection of the trailing edge of each desired pulse.

7. The invention claimed in claim 6 wherein said pulse generating circuit provides a pulse begin signal of relatively short duration at the beginning of each desired pulse, and wherein said pulse begin signal is coupled to said pulse regeneration circuit so to enable said circuit at the beginning of each received pulse.

8. The invention claimed in claim 7 wherein said pulse regeneration circuit comprising an AND gate and a two stage latching device.

9. The invention claimed in claim 8 wherein said AND gate has two input terminals the first one of which is coupled to said desired pulses.

10. The invention claimed in claim 9 wherein said other input terminal is connected to said two stage latching device which is controlled by said pulse begin signal.

11. A noise blanking circuit for interposition between a switching circuit and the output of a pulse width modulating circuit providing both an oscillator pulse signal synchronized with the circuit pulse rate providing a digital stream of information pulses comprising: a first flip-flop logic device with an output connected to one input of an AND logic device, said first flip-flop having a set and reset inputs, said set input being connected to said oscillator pulse signal, a pulse detection device for detecting the trailing edge of each informational pulses, and said reset input of said flip-flop being connected to an output of said pulse detection device.

12. The invention claimed in claim 11 wherein said AND logic device has an output which provides a digital stream of information pulses in response to pulses on said AND logic device input, and no signals in response to noise signals received between said pulses which are coupled to said AND logic device input.

13. The invention recited in claim 12 wherein said pulse detection device disabled said AND logic device during the interval between pulses.

* * * * *